United States Patent [19]

Kaida et al.

[11] Patent Number: 5,434,547

[45] Date of Patent: * Jul. 18, 1995

[54] TUNING FORK TYPE PIEZOELECTRIC RESONATOR HAVING STEPS FORMED IN ARMS OF THE TUNING FORK

[75] Inventors: Hiroaki Kaida; Hiroshi Nakatani, both of Kyoto, Japan

[73] Assignee: Murata Manufacturing Co., Ltd., Japan

[*] Notice: The portion of the term of this patent subsequent to Oct. 27, 2009 has been disclaimed.

[21] Appl. No.: 895,907

[22] Filed: Jun. 9, 1992

[30] Foreign Application Priority Data

Sep. 13, 1991 [JP] Japan ................................ 3-234401

[51] Int. Cl.⁶ ........................................... H03H 9/21
[52] U.S. Cl. ................................. 333/187; 333/200; 310/370; 331/156
[58] Field of Search ............... 84/457, 732, DIG. 24; 331/155, 156; 333/186–192, 200; 310/367, 370, 312, 367, 370

[56] References Cited

U.S. PATENT DOCUMENTS

| | | |
|---|---|---|
| 3,657,667 | 4/1972 | Nishikubo et al. .......... 331/156 X |
| 3,683,213 | 8/1972 | Staudte ...................... 310/9.6 |
| 3,697,789 | 10/1972 | Kato et al. . |
| 4,178,566 | 12/1979 | Kawashima ................. 331/156 |
| 4,191,906 | 3/1980 | Kogure ........................ 310/370 |
| 4,379,244 | 4/1983 | Dinger ......................... 310/312 |
| 4,415,827 | 11/1983 | Chuang ....................... 310/370 |
| 4,540,909 | 9/1985 | Takahashi et al. ........... 310/370 |
| 4,654,663 | 3/1987 | Alsenz et al. ............ 331/156 X |
| 5,159,301 | 10/1992 | Kaisa et al. ................. 333/187 |
| 5,192,925 | 3/1993 | Kaida .......................... 333/187 |

FOREIGN PATENT DOCUMENTS

| | | | |
|---|---|---|---|
| 0068012 | 6/1981 | Japan ........................... | 310/370 |
| 0170614 | 10/1982 | Japan ........................... | 310/370 |
| 0199314 | 12/1982 | Japan ........................... | 310/370 |

*Primary Examiner*—William M. Shoop, Jr.
*Assistant Examiner*—Jeffrey W. Donels
*Attorney, Agent, or Firm*—Ostrolenk, Faber, Gerb & Soffen

[57] ABSTRACT

A tuning fork type piezoelectric resonator constructed by forming tuning fork arm portions on both sides of a first slit provided for a piezoelectric substrate, forming resonance electrodes on both major surfaces of the piezoelectric substrate in a region around the first slit, and forming steps in outer edges of the tuning fork arm portions.

8 Claims, 10 Drawing Sheets

PRIOR ART

TUNING FORK TYPE PIEZOELECTRIC RESONATOR HAVING STEPS FORMED IN ARMS OF THE TUNING FORK

BACKGROUND OF THE INVENTION

1. Field of the Invention

The present invention relates generally to a tuning fork type piezoelectric resonator in which a piezoelectric substrate is provided with a slit and tuning fork arm portions are formed on both sides of the slit, and more particularly, to a tuning fork type piezoelectric resonator provided with a structure for preventing leakage of vibration from tuning fork arm portions.

2. Description of the Prior Art

One example of a conventional tuning fork type piezoelectric resonator will be described with reference to FIG. 2.

A tuning fork type piezoelectric resonator 1 is constructed using a rectangular piezoelectric substrate 2. A first slit 5 is formed so as to extend inward from the center of one edge 2a of the piezoelectric substrate 2. Second and third slits 4 and 5 are similarly formed on both sides of the first slit 3 so as to extend inward from the edge 2a. Piezoelectric tuning fork arm portions 6 and 7 are formed on both sides of the first slit 3 by thus forming the second and third slits 4 and 5 on both sides of the first slit 3. Resonance electrodes 8 and 9 are formed on both major surfaces of the piezoelectric substrate 2 in a region around the innermost part of the first slit In FIG. 2, electrodes formed on the reverse surface of the piezoelectric substrate 2 are illustrated with the lower surface of the piezoelectric substrate 2 being projected downward as shown.

The tuning fork type piezoelectric resonator 1 is so constructed that a region where the resonance electrodes 8 and 9 are opposed to each other is vibrated by applying a voltage from terminal electrodes 10a and 10b connected to the resonance electrodes 8 and 9, so that the piezoelectric tuning fork arm portions 6 and 7 are vibrated in a tuning fork type mode of vibration.

In the tuning fork type piezoelectric resonator 1, the above described second and, third slits 4 and 5 are formed in the rectangular piezoelectric substrate 2 so as not to prevent vibration from the tuning fork arm portions 6 and 7. When the tuning fork type piezoelectric resonator 1 is fixed to a circuit board or the like by solder or the like, however, the resonance characteristics of the tuning fork type piezoelectric resonator 1 may, in some cases, be largely varied from the original resonance characteristics.

Figure 3:
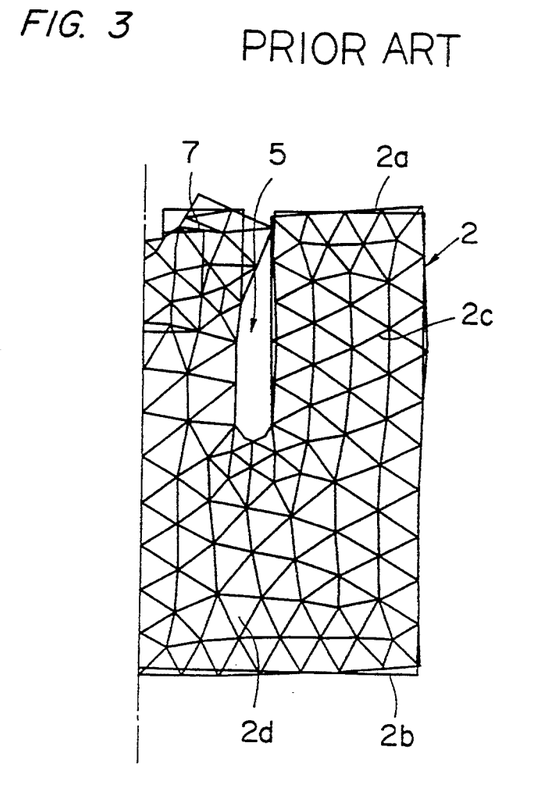
FIG. 3 is a schematic plan view showing the distribution of displacement of the conventional tuning fork type piezoelectric resonator.

Therefore, the inventors of the present application have analyzed the vibrating state of the tuning fork arm portions 6 and 7 in the tuning fork type piezoelectric resonator 1 using the finite element method, thereby to recognize that not only the tuning fork arm portion 7 but also other portions of the piezoelectric substrate are displaced. More specifically, it is recognized that even a piezoelectric substrate portion 2a outside of the third slit 5 and a piezoelectric substrate portion 2d on the side of an edge 2b opposed to the edge 2a are displaced as the tuning fork arm portion 7 is vibrated.

In the conventional tuning fork type piezoelectric resonator 1, therefore, it is found that the piezoelectric substrate portions 2c and 2d which are portions fixed to a circuit board or the like are displaced by leakage of vibration from the tuning fork arm portions 6 and 7 positively displaced. As a result, when the piezoelectric substrate portions 2c and 2d are fixed to the circuit board or the like, the vibration is restrained in the piezoelectric substrate portions 2c and 2d. Accordingly, the vibrating state of the tuning fork arm portions 6 and 7 is affected by the above described fixing, so that the resonance characteristics of the tuning fork type piezoelectric resonator 1 are forced to be degraded.

SUMMARY OF THE INVENTION

An object of the present invention is to provide a tuning fork type piezoelectric resonator whose resonance characteristics are not degraded when tuning fork arm portions are fixed to a circuit board or the like because vibration energy in the tuning fork arm portions hardly leaks to other portions of a piezoelectric substrate.

The present invention provides a tuning fork type piezoelectric resonator comprising a piezoelectric substrate provided with a slit inward from its one edge, and at least one pair of resonance electrodes formed so as to be opposed to each other while being separated by the piezoelectric substrate in a region around the above described slit, tuning fork arm portions being formed in portions of the piezoelectric substrate on both sides of the slit by the formation of the slit, which is characterized in that steps are formed in outer edges of the above described tuning fork arm portions.

According to the present invention, steps are formed in outer edges of tuning fork arm portions, so that parts on the side of top ends from the steps of the tuning fork arm portions are vibrated more smoothly. Consequently, vibration from the tuning fork arm portions does not easily leak to other portions of a piezoelectric substrate. Even if portions other than the tuning fork arm portions of the piezoelectric substrate are fixed to other members, a circuit board or the like, therefore, it is difficult to prevent the vibration from the tuning fork arm portions. Accordingly, it is possible to provide a tuning fork type piezoelectric resonator whose resonance characteristics are not easily degraded.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described to clarify a tuning fork type piezoelectric resonator according to the present invention.

Figure 1:
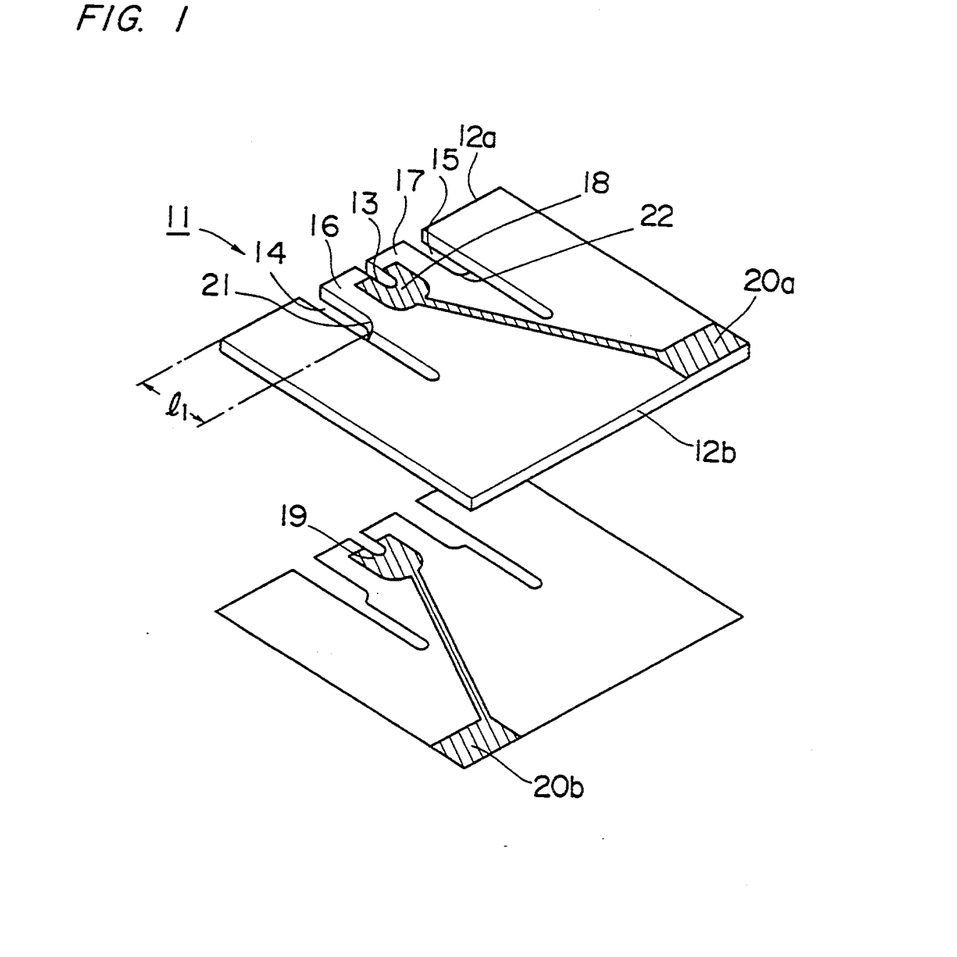
FIG. 1 is a perspective view showing a tuning fork type piezoelectric resonator according to one embodiment of the present invention.

FIG. 1 is a perspective view showing a tuning fork type piezoelectric resonator according to one embodiment of the present invention. In a tuning fork type piezoelectric resonator 11, a first slit 13 is formed inward from the center of one edge 12a of a rectangular piezoelectric substrate 12. Second and third slits 14 and 15 are similarly formed on both sides of the first slit 13 so as to be longer than the first slit 13 inward from the edge 12a. Tuning fork arm portions 16 and 17 are formed on both sides of the first slit 13 by thus forming the second and third slits 14 and 15 on both sides of the slit 1S.

Furthermore, resonance electrodes 18 and 19 are formed so as to be opposed to each other while being separated by the piezoelectric substrate 12 in a region around the first slit 13.

Figure 2:
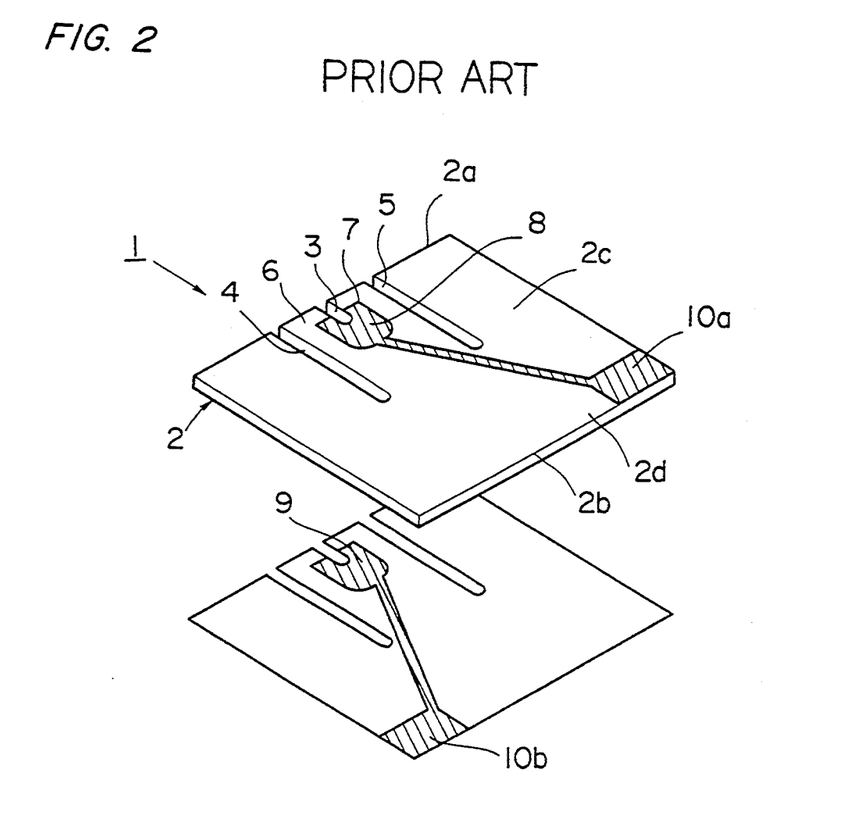
FIG. 2 is a perspective view showing a conventional tuning fork type piezoelectric resonator.

In FIG. 1, electrodes formed on the lower surface of the piezoelectric substrate 12 are illustrated with the lower surface of the piezoelectric substrate 12 being projected downward, similarly to the case of the piezoelectric resonator 1 shown in FIG. 2.

The resonance electrodes 18 and 19 are electrically connected to terminal electrodes 20a and 20b formed on the side of an edge 12b of the piezoelectric substrate 12, respectively.

The above described components are the same as those in the conventional piezoelectric resonator 1. The present embodiment is characterized in that steps 21 and 22 are formed in outer edges of the tuning fork arm portions 16 and 17. More specifically, the tuning fork arm portions 16 and 17 are so constructed that their parts on the side of their top ends from the steps 21 and 22 are made narrower by forming the steps 21 and 22. Since the steps 21 and 22 are thus formed on the outer edges of the tuning fork arm portions 16 and 17, vibration from the tuning fork arm portions 16 and 17 does not easily leak to other portions of the piezoelectric substrate 12, in the tuning fork type piezoelectric resonator 11 according to the present embodiment. The reason for this will be described with reference to FIG. 4.

Figure 4:
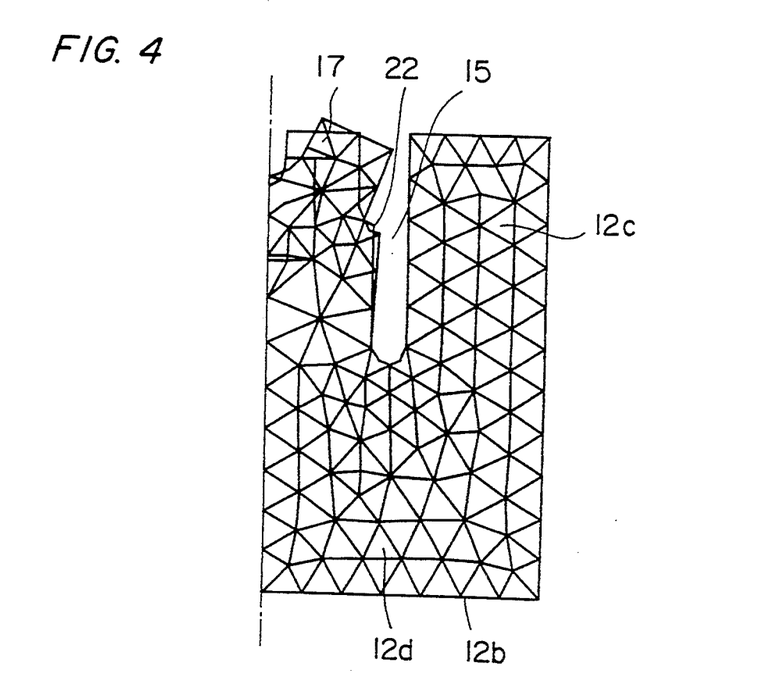
FIG. 4 is a schematic plan view showing the distribution of displacement of the tuning fork type piezoelectric resonator according to the embodiment.

FIG. 4 is a schematic plan view showing a state where the distribution of displacement of a portion on the right side of the piezoelectric substrate 12 in the tuning fork type piezoelectric resonator 11 is analyzed using the finite element method. As apparent from FIG. 4, the tuning fork arm portion 17 is displaced in accordance with a tuning fork type mode of vibration. In this case, however, it is found that portions other than the tuning fork arm portion 17 of the piezoelectric substrate, for example, a piezoelectric substrate portion 12c outside of the third slit 15 and a piezoelectric substrate portion 12d on the side of the edge 12b are hardly displaced. More specifically, a part on the side of a top end from the step 22 of the tuning fork arm portion 17 is smoothly vibrated by the formation of the step 22. Therefore, it is considered that vibration energy in the tuning fork arm portion 17 does not easily leak to the other portions of the piezoelectric substrate.

Accordingly, in the tuning fork type piezoelectric resonator 11, vibration from the tuning fork arm portions 16 and 17 does not easily leak to the other portions of the piezoelectric substrate. Even if a region other than the tuning fork arm portions 16 and 17 of the piezoelectric substrate 12 is fixed to a circuit board as a holding portion, therefore, the vibration from the tuning fork arm portions 16 and 17 is not prevented. Consequently, the resonance characteristics of the tuning fork type piezoelectric resonator 11 are not easily degraded.

Meanwhile, the position where the steps 21 and 22 are formed, that is, the length $l_1$ shown in FIG. 1 is not particularly limited. For example, the depth of the first slit 13 and the above described length $l_1$ may be made equal to each other. Alternatively, the above described length $l_1$ may be made larger than the depth of the first slit 13, as shown in FIG. 1. It is considered that the position where the steps 21 and 22 are formed differs depending on the frequency of the tuning fork type piezoelectric resonator 11, the shape and the size of the tuning fork arm portions 16 and 17, and the like. Consequently, the position where the steps 21 and 22 are formed is not limited to a particular position as described above.

Figure 5:
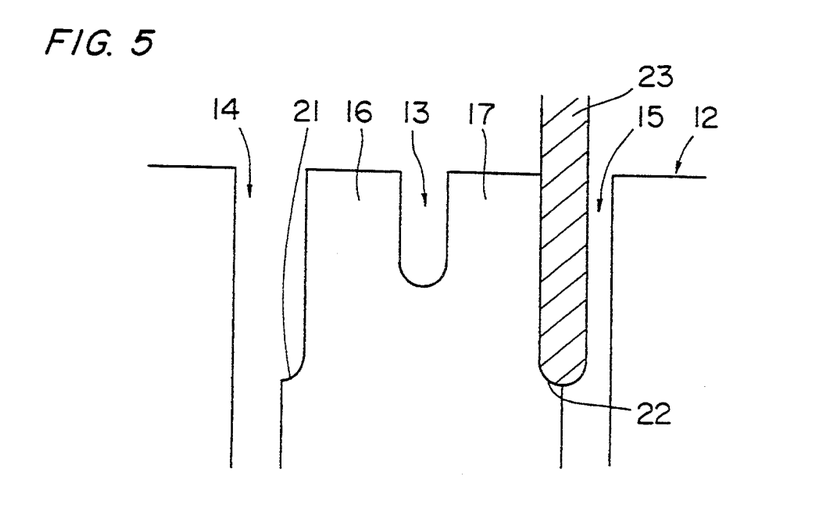
FIG. 5 is a partially enlarged plan view for explaining the process for forming steps.

The steps 21 and 22 can be formed by partially cutting out outer edge parts of the tuning fork arm portions 16 and 17 so as to narrow the parts on the side of the top ends of the tuning fork arm portions 16 and 17. A method itself of forming the steps 21 and 22 is not particularly limited. For example, however, the steps 21 and 22 can be easily formed by cutting out the piezoelectric substrate 12 provided with the first slit 13 and the second and third slits 14 and 15 again using a blade 23 used so as to form the second and third slits 14 and 15 in the piezoelectric substrate 12. That is, it is possible to simply form the above described steps 21 and 22 without requiring a new apparatus if the blade 23 used so as to form the second and third slits 14 and 15 is used.

An example in which the tuning fork type piezoelectric resonator 11 shown in FIG. 1 is constructed as a tip component will be described with reference to FIGS. 6 and 7.

Figure 6:
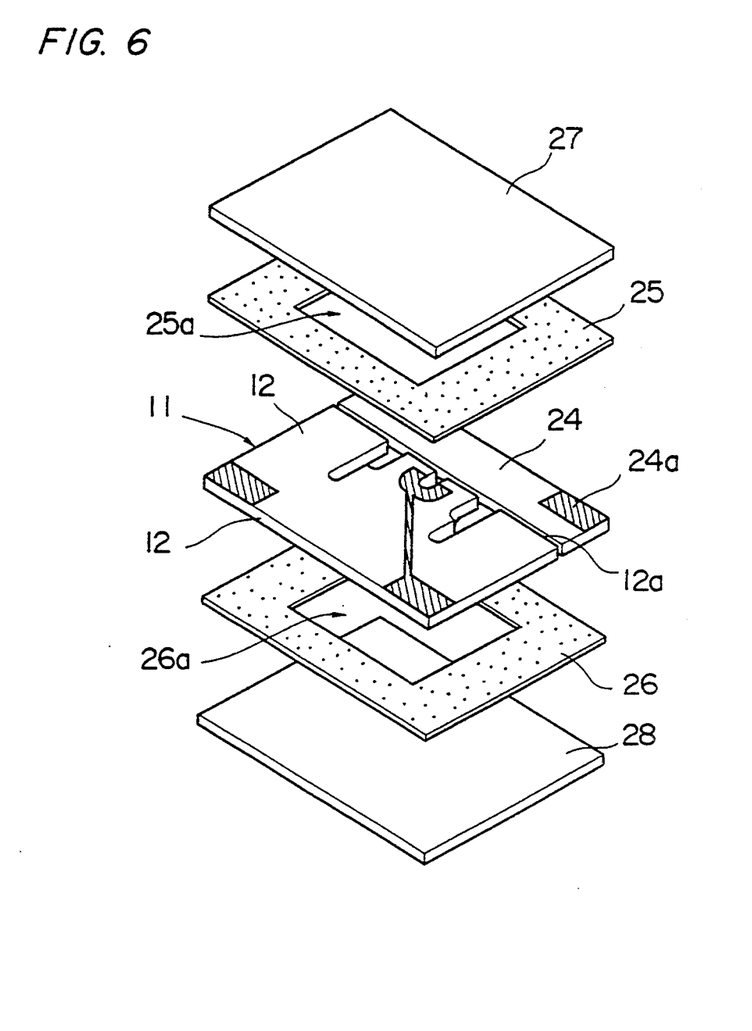
FIG. 6 is an exploded perspective view for explaining the processes for constructing the tuning fork type piezoelectric resonator according to the embodiment as a tip type tuning fork type piezoelectric resonance component.

As shown in FIG. 6, a dummy substrate 24 made of insulating ceramics having the same thickness as that of a piezoelectric substrate 12 is arranged beside the tuning fork type piezoelectric resonator 11. In this case, the dummy substrate 24 must be arranged a predetermined distance away from an edge 12a of the piezoelectric substrate 12 so as not to prevent vibration from tuning fork arm portions 16 and 17. An electrode 24a illustrated on the upper surface of the dummy substrate 24 is formed so as to make the entire thicknesses of the tuning fork type piezoelectric resonator 11 and the dummy substrate 24 equal to each other.

Sealing substrates 27 and 28 are affixed to upper and lower surfaces of the tuning fork type piezoelectric resonator 11 and the dummy substrate 24 while being separated by spacers 25 and 26 made of an insulating material.

Although the rectangular frame-shaped spacers 25 and 26 can be composed of insulating films or the like respectively having openings 25a and 26a for not preventing vibration from tuning fork arm portions 16 and 17, they may be constructed by applying insulating adhesives over the sealing substrates 27 and 28 so as to have the same shape as the plane shape of the spacers 25 and 26.

The sealing substrates 27 and 28 can be made of insulating ceramics such as alumina and a rigid material such as synthetic resign.

Figure 7:
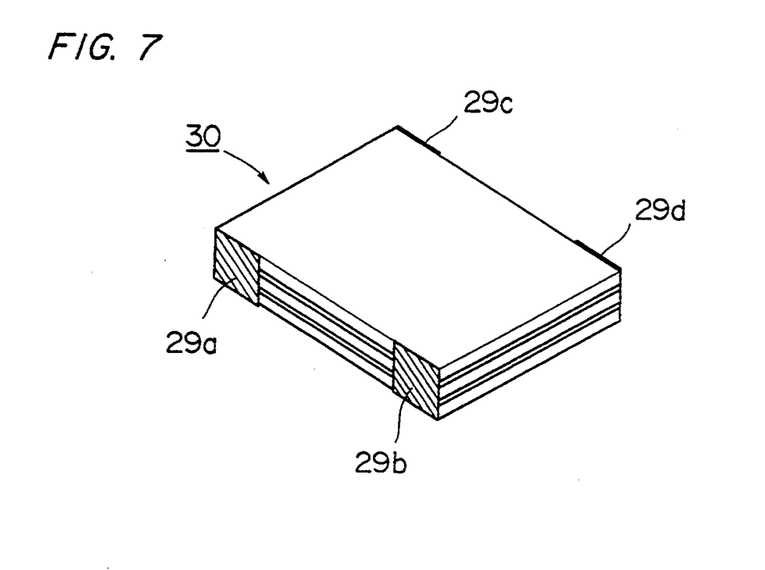
FIG. 7 is a perspective view showing a tip type piezoelectric resonance component constructed using the tuning fork type piezoelectric resonator according to the embodiment.

Outer electrodes 29a and 29b are formed as shown in FIG. 7 in a laminated body obtained in the above described manner, thereby to make it possible to obtain a tip-type tuning fork type piezoelectric resonance component 30. In FIG. 7, outer electrodes 29c and 29d are dummy outer electrodes and thus, are not particularly required.

Figure 8:
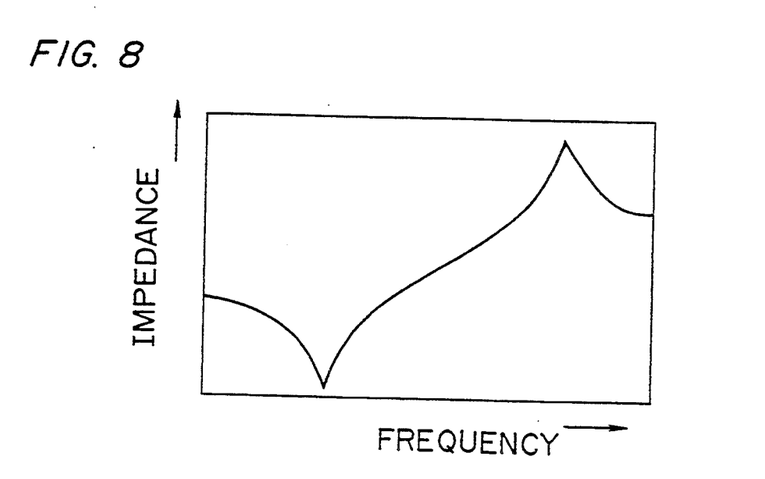
FIG. 8 is a diagram showing the impedance-frequency characteristics of the tuning fork type piezoelectric resonator according to the embodiment.
Figure 9:
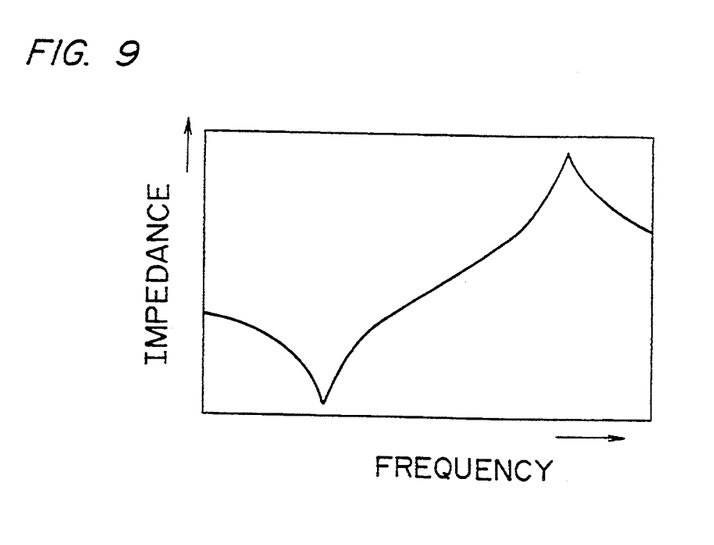
FIG. 9 is a diagram showing the impedance-frequency characteristics of the tuning fork type piezoelectric resonance component shown in FIG. 7.

FIG. 8 is a diagram showing the impedance-frequency characteristics of the above described tuning fork type piezoelectric resonator 11, and FIG. 9 is a diagram showing the impedance-frequency characteristics, in a case where the tuning fork type piezoelectric resonator 11 is constructed as the tuning fork type piezoelectric resonance component 30 shown in FIG. 7, of the tuning fork type piezoelectric resonance component 30. As can be seen from comparison between FIG. 8 and FIG. 9, even when the sealing substrates 27 and 28 are affixed to the tuning fork type piezoelectric resonator 11 and the portions other than the tuning fork arm portions of the piezoelectric substrate are fixed to the sealing substrates, the resonance characteristics are hardly changed.

Figure 10:
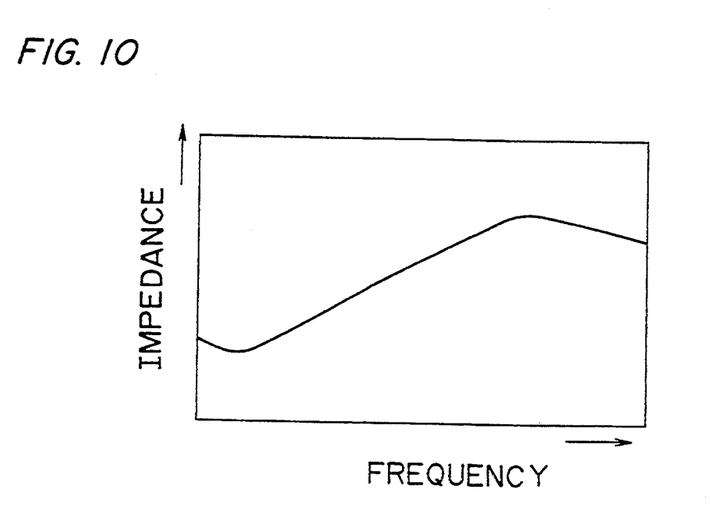
FIG. 10 is a diagram showing the impedance-frequency characteristics, in a case where the conventional tuning fork type piezoelectric resonator is constructed as a tip type tuning fork type piezoelectric resonance component, of the tip type piezoelectric resonance component.

On the other hand, FIG. 10 shows the impedance-frequency characteristics, in a case where the conventional tuning fork type piezoelectric resonator 1 exhibiting the same impedance-frequency characteristics as the impedance-frequency characteristics shown in FIG. 8 is similarly constructed as a tip type piezoelectric resonance component using a dummy substrate, spacers and sealing substrates, of the tip type piezoelectric resonance component. As can be seen from comparison between FIG. 10 and FIG. 8, when portions other than the tuning fork arm portions of the piezoelectric substrate are fixed, the resonance characteristics are significantly degraded.

Figure 11:
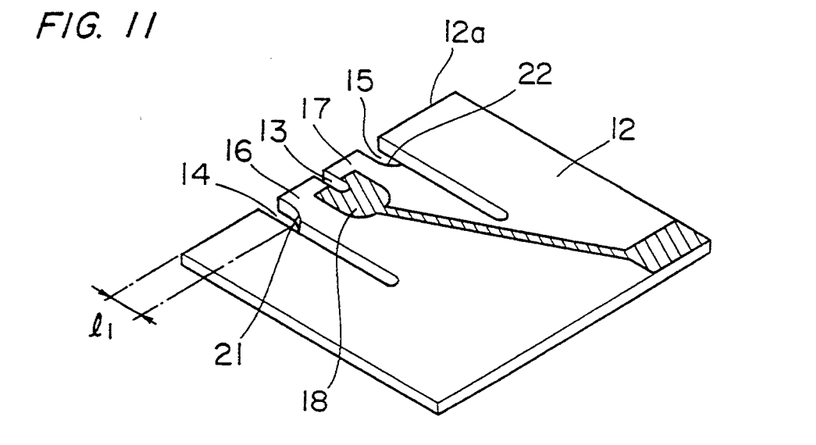
FIG. 11 is a perspective view for explaining a modified example in which the positions of steps are altered.

Although in the tuning fork type piezoelectric resonator 11 shown in FIG. 1, the position where the steps 21 and 22 are formed, that is, the distance $l_1$ from the edge 12a to the steps 21 and 22 is made longer than the depth of the first slit 13, the position where the steps 21 and 22 are formed is not limited to the same in the tuning fork type piezoelectric resonator according to the present invention. More specifically, the distance $l_1$ may be made equal to the depth of the first slit 13, as shown in FIG. 11. Since this distance $l_1$ differs depending on the resonance frequency of the tuning fork type piezoelectric resonator 11 and the plane shape and the size of the tuning fork arm portions 16 and 17 to be objectives, it is not limited to a particular distance as described above.

Figure 12:
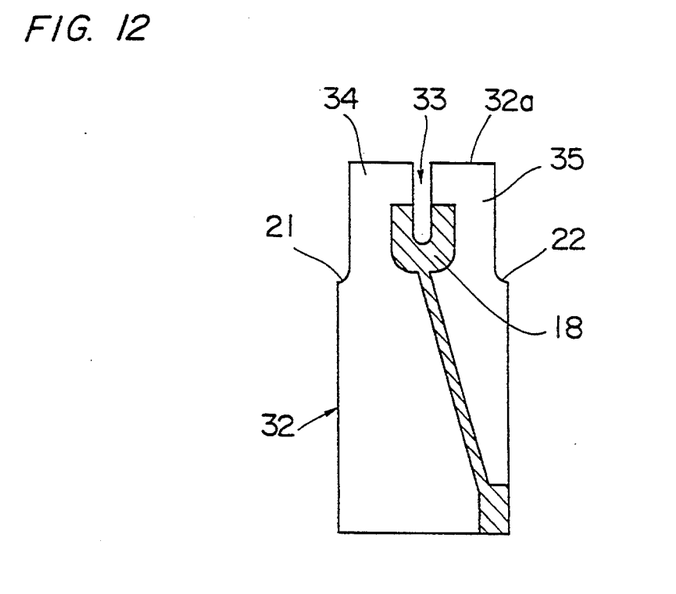
FIG. 12 is a plan view showing a tuning fork type piezoelectric resonator according to another embodiment of the present invention.

Furthermore, although in the tuning fork type piezoelectric resonator 11 shown in FIG. 1, the second and third slits 14 and 15 are formed, thereby to form the tuning fork arm portions 16 and 17 in the piezoelectric substrate 12, the second and third slits 14 and 15 are not indispensable components in the tuning fork type piezoelectric resonator according to the present invention. For example, as shown in FIG. 12, the tuning fork type piezoelectric resonator 11 may be so constructed that a first slit 33 is formed so as to extend inward from the center of one edge 32a of a rectangular piezoelectric substrate 32, thereby to form tuning fork arm portions 34 and 35 on both sides of the first slit 33. In this case, an outer edge of the piezoelectric substrate 32 coincides with outer edges of the tuning fork arm portions 34 and 35, and steps 21 and 22 are formed in parts of the outer edges of the tuning fork arm portions 34 and 35.

Furthermore, although in the tuning fork type piezoelectric resonator 11 shown in FIG. 1, the pair of resonance electrodes 18 and 19 is formed on both major surfaces of the piezoelectric substrate 12 in a region in the vicinity of the innermost part of the first slit 13, the tuning fork type piezoelectric resonator to which the present invention is applied is not limited to one having such resonance electrodes 18 and 19. For example, also in a tuning fork type piezoelectric resonator 41 so constructed that a first resonance electrodes 44 is formed around a first slit 43 and resonance electrodes 48 and 49 are formed in the vicinity of outer edges of tuning fork arm portions 46 and 47 on the upper surface of a piezoelectric substrate 42, and resonance electrodes 50, 51 and 52 are formed on the lower surface of the piezoelectric substrate 42 so as to be opposed to the resonance electrodes 44, 48 and 49 on the upper surface while being separated by the piezoelectric substrate 42, steps 21 and 22 are formed in the outer edges of the tuning fork arm portions 46 and 47, as shown in FIG. 13, thereby to make it possible to prevent the degradation of the resonance characteristics of the tuning fork type piezoelectric resonator 41, similarly to the present invention.

Figure 13:
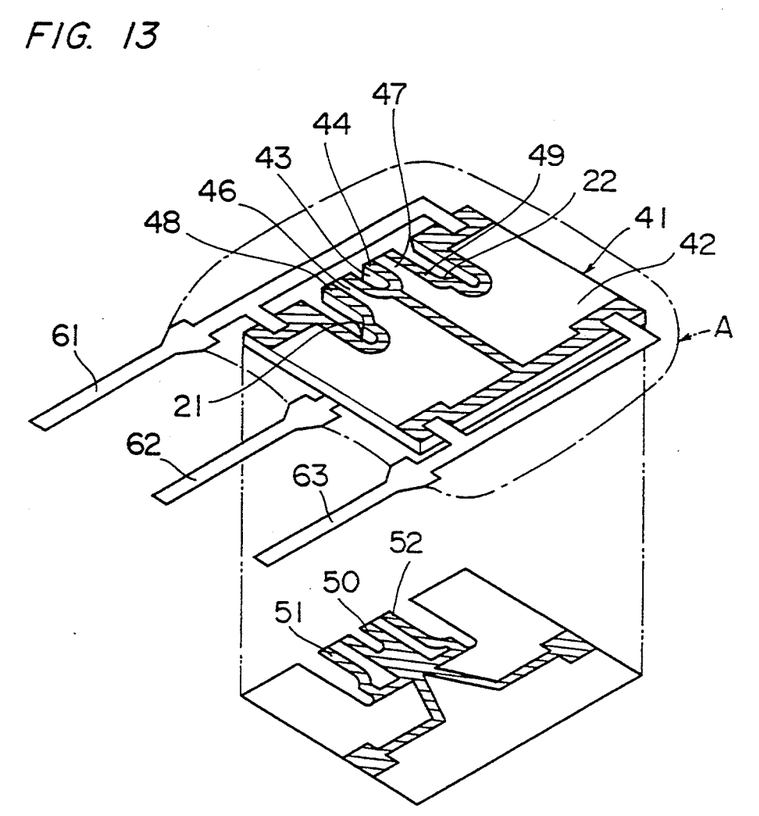
FIG. 13 is a perspective view for explaining a tuning fork type piezoelectric resonator according to still another embodiment of the present invention.

Although the tuning fork type piezoelectric resonator 41 shown in FIG. 13 can be also constructed as a tip type tuning fork type piezoelectric resonance component as in the example of the construction shown in FIGS. 6 and 7, it may be constructed as a resin mold type component with leads by joining lead terminals 61 to 63 and by resin sheathing as represented by a one-dot and dash line A, as shown in FIG. 13.

Similarly, the piezoelectric resonator 11 shown in FIG. 1 can be constructed as a resin mold type component with leads.

Application to Edge Mode Resonator

Figure 14:
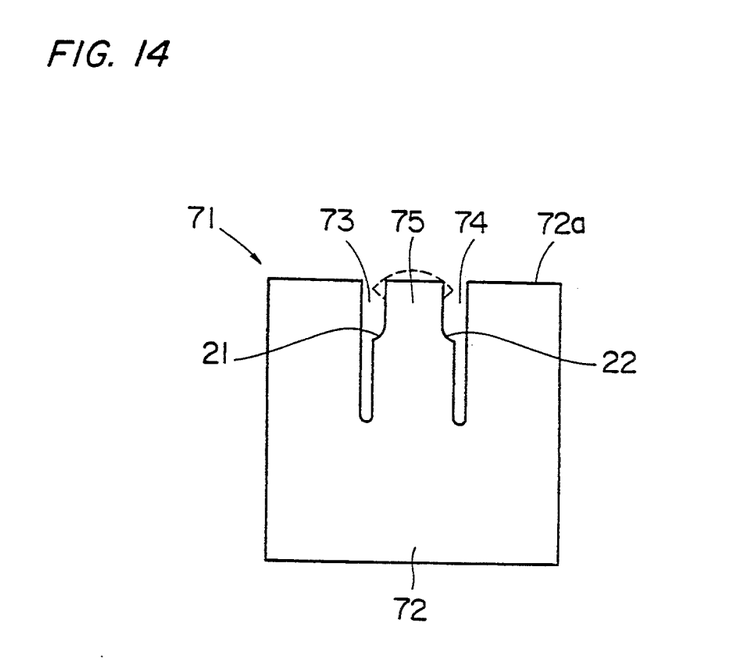
FIG. 14 is a schematic plan view for explaining an edge mode resonator.

In the present invention, the above described steps are formed in the outer edges of the tuning fork arm portions, thereby to prevent the degradation of the resonance characteristics. The function of the steps can be also utilized in an edge mode resonator 71 shown in FIG. 14. In the edge mode resonator 71, first and second slits 73 and 74 are formed with predetermined spacing so as to extend inward from one edge 72a of a rectangular piezoelectric substrate 72, and a vibrating portion 75 interposed between the first and second slits 73 and 74 is displaced from a state represented by a solid line to a state represented by a broken line. Also in such an edge mode resonator 71, if steps 21 and 22 are formed in both outer edges of the vibrating portion 75, the vibration of a part on the side of a top end of the vibrating portion 75 is made smooth by the steps 21 and 22. Therefore, it is considered that the degradation of the resonance characteristics of the edge mode resonator 71 can be similarly prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning fork type piezoelectric resonator comprising:
    a piezoelectric substrate provided with a slit extending inwardly from one edge thereof; and
    at least one pair of resonance electrodes formed in a region around said slit so as to be opposed to each other while being separated by the piezoelectric substrate;
    tuning fork arm portions being respectively defined by said slit in portions of the piezoelectric substrate on both sides of the slit,
    ends of said tuning fork arm portions having steps in outer edges thereof thereby defining portions of said tuning fork arm portions that are narrower than the remaining portions of said tuning fork arm portions, said steps extending inwardly from said one edge of said piezoelectric substrate along said outer edges of said tuning fork arm portions.

2. The tuning fork type piezoelectric resonator according to claim 1, wherein said pair of resonance electrodes are provided on both major surfaces of said piezoelectric substrate, respectively, in a region in the vicinity of the innermost part of said slit.

3. The tuning fork type piezoelectric resonator according to claim 1, which further comprises terminal electrodes provided along an edge on an opposite side of said piezoelectric substrate from said one edge and electrically connected to said resonance electrodes, respectively.

4. The tuning fork type piezoelectric resonator according to claim 1, wherein second and third slits are respectively provided a predetermined distance away from said first-mentioned slit on both sides of said first mentioned slit so as to extend inwardly from said one edge of said piezoelectric substrate, so that said pair of tuning fork arm portions are defined in a region between the second and third slits.

5. The tuning fork type piezoelectric resonator according to claim 4, wherein said pair of resonance electrodes are provided on both major surfaces of the piezoelectric substrate, respectively in a region in the vicinity of the innermost part of said first-mentioned slit.

6. The tuning fork type piezoelectric resonator according to claim 4, wherein
    one of said resonance electrodes comprises a first resonance electrode formed provided around said first-mentioned slit and along inner edges of the tuning fork arm portions, and a second resonance electrode provided along outer edges of the tuning fork arm portions, and
    the other resonance electrode comprises a third resonance electrode provided on the other major surface of the piezoelectric substrate so as to be opposed to said first and second resonance electrodes while being separated by the piezoelectric substrate.

7. The tuning fork type piezoelectric resonator according to claim 4, which further comprises terminal electrodes provided along an edge on an opposite side of said piezoelectric substrate from said one edge and electrically connected to said resonance electrodes, respectively.

8. The tuning fork type piezoelectric resonator according to claim 1, wherein when said narrower portions of said tuning fork arm portions are vibrated, leakage of vibration energy from said tuning fork arm portions is prevented so that degradation of resonance characteristic of the tuning fork type piezoelectric resonator is prevented.

* * * * *